United States Patent [19]

Wang

[11] Patent Number: 5,038,058
[45] Date of Patent: Aug. 6, 1991

[54] BICMOS TTL OUTPUT DRIVER

[75] Inventor: Michael D. Wang, Gilbert, Ariz.

[73] Assignee: Motorola, Inc., Schaumburg, Ill.

[21] Appl. No.: 609,560

[22] Filed: Nov. 6, 1990

[51] Int. Cl.$^5$ .................................................. H03K 19/88
[52] U.S. Cl. ................................... 307/475; 307/446; 307/570; 307/443
[58] Field of Search ................ 326/48.84 T, 48.58 R, 326/48.16 D, 47.25 H, 48.17 G, 48.65 T; 307/475, 446, 570, 270, 443

[56] References Cited

U.S. PATENT DOCUMENTS

| | | | |
|---|---|---|---|
| 4,593,210 | 6/1986 | Boyer | 307/443 |
| 4,697,103 | 9/1987 | Ferris et al. | 307/443 |
| 4,703,203 | 10/1987 | Gallup et al. | 307/451 |
| 4,704,548 | 11/1987 | Strong et al. | 307/443 |
| 4,740,718 | 4/1988 | Matsui | 307/446 |
| 4,902,914 | 2/1990 | Masuoka | 307/446 |
| 4,912,344 | 3/1990 | Yin | 307/443 |
| 4,970,414 | 11/1990 | Ruth, Jr. | 307/542 |

Primary Examiner—Stanley D. Miller
Assistant Examiner—Scott A. Ouellette
Attorney, Agent, or Firm—Bradley J. Botsch

[57] ABSTRACT

An output driver circuit having a CMOS logic level input signal applied at an input for providing a TTL logic level output signal at an output includes a push and a pull transistor for respectively pushing and pulling current at the output of the circuit. A first circuit, responsive to the input signal and coupled to the bases of the push and pull transistors, for alternately rendering the push and pull transistors operative, the first circuit controlling a DC drive of the pull transistor. A second circuit, responsive to the input and output signals, for increasing the voltage at the base of the pull transistor when the input and output signals are in predetermined logic states, the second circuit controlling the transient response of the output signal.

20 Claims, 1 Drawing Sheet

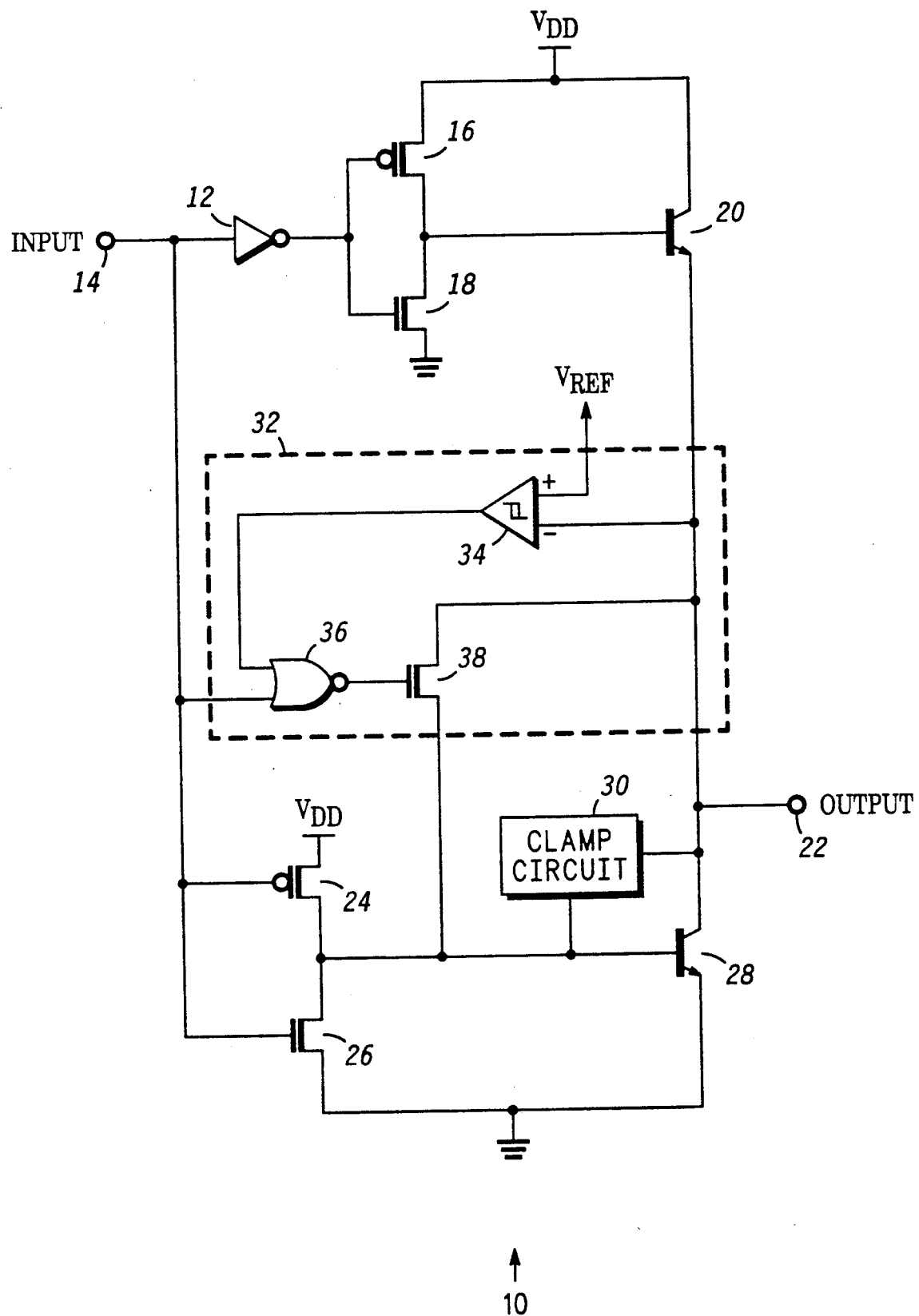

BICMOS TTL OUTPUT DRIVER

BACKGROUND OF THE INVENTION

This invention relates to output drivers and, in particular, to BiCMOS TTL output drivers having independent DC drive and transient response controls.

A typical TTL output driver has push and pull transistors both coupled to an output for respectively providing a logic high and a logic low voltage level at the output. The push and pull transistors are typically coupled to a control circuit for alternately rendering the push and pull transistors operative in response to an input logic signal. The pull transistor of a typical TTL output driver, when operative, usually must sink a predetermined DC drive current since it is typically coupled to a TTL input circuit which will source a predetermined current when pulled into a logic low state. Further, as the DC drive current through the pull transistor increases, the transition rate (transient response) from a logic high voltage level to a logic low voltage level also increases. Therefore, a large DC drive corresponds to a fast transient response while a small DC drive corresponds to a slow transient response. However, some applications may require a small DC drive with a fast transient response, or even a large DC drive with a slow transient response. Therefore, it would be advantageous to provide a circuit to control the transient response independent of the DC drive.

Hence, a need exists for an output driver circuit having independent DC drive and transient response controls.

SUMMARY OF THE INVENTION

Accordingly, it is an object of the present invention to provide an improved output driver circuit.

Another object of the present invention is to provide an improved output driver circuit having independent DC drive and transient response controls.

Yet another object of the present invention is to provide an improved output driver circuit having a CMOS logic signal input and a TTL logic signal output.

In carrying out the above and other objects of the present invention there is provided a circuit having an input signal applied at an input and an output signal provided at an output comprising a first circuit, having an input, for pushing current to the output of the circuit when the first circuit is operative; a second circuit, having an input, for pulling current from the output of the circuit when the second circuit is operative; a third circuit, responsive to the input signal and coupled to the inputs of the first and second circuits, for alternately rendering the first circuit and the second circuit operative, the third circuit controlling a DC drive of the second circuit; and a fourth circuit for increasing the voltage at the input of the second circuit when the input and output signals are in predetermined logic states, the fourth circuit controlling the transient response of the output signal.

The above and other objects, features and advantages of the present invention will be better understood from the following detailed description taken in conjunction with the accompanying drawing.

BRIEF DESCRIPTION OF THE DRAWING

The sole figure is partial schematic diagram illustrating an output driver circuit of the present invention.

DETAILED DESCRIPTION OF THE INVENTION

Referring to the sole figure, a partial schematic diagram of output driver circuit 10 is shown comprising inverter 12 having an input coupled to terminal 14 and an output coupled to the gate electrodes of PMOS and NMOS transistors 16 and 18. The source electrode of PMOS transistor 16 is coupled to a first supply voltage terminal at which the operating potential $V_{DD}$ is applied. The drain electrode of PMOS transistor 16 is coupled to the drain electrode of NMOS transistor 18 and to the base of transistor 20. The source electrode of NMOS transistor 18 is returned to ground while the collector of transistor 20 is coupled to operating potential $V_{DD}$. Further, the emitter of transistor 20 is coupled to terminal 22. Terminal 14 is also coupled to the gate electrodes of PMOS and NMOS transistor 24 and 26. The source electrode of PMOS transistor 24 is coupled to operating potential $V_{DD}$ while the drain electrode of the same is coupled to the drain electrode of NMOS transistor 26 and to the base of transistor 28. Both the source electrode of NMOS transistor 26 and the emitter of transistor 28 are returned to ground. Further, the collector of transistor 28 is coupled to terminal 22. Clamp circuit 30 is coupled across the base and collector of transistor 28. Transient response control circuit 32 is shown including comparator circuit 34, NOR gate 36 and NMOS transistor 38. Comparator circuit 34 has a first input coupled for receiving a reference voltage $V_{REF}$, and a second input coupled to terminal 22. The output of comparator circuit 34 is coupled to a first input of NOR gate 36 while the second input of NOR gate 36 is coupled to terminal 14. The output of NOR gate 36 is coupled to the gate electrode of NMOS transistor 38. The drain electrode of NMOS transistor 38 is coupled to terminal 22 while the source electrode of the same is coupled to the base of transistor 28.

A CMOS level input logic signal is applied to terminal 14 of output driver circuit 10 while a TTL level output logic signal is provided at terminal 22. Further, PMOS transistor 16, NMOS transistor 18 and inverter 12 provide a circuit to render transistor 20 operative when the voltage applied at terminal 14 is indicative of a logic high level, while PMOS transistor 24 and NMOS transistor 26 provide a circuit to render transistor 28 operative when the voltage applied at terminal 14 is indicative of a logic low level. In particular, when a CMOS logic high voltage level is applied to terminal 14, PMOS transistor 16 and NMOS transistor 26 are rendered operative, while NMOS transistor 18 and PMOS transistor 24 are rendered non-operative. Since PMOS transistor 16 is rendered operative, current will flow from operating potential $V_{DD}$ through PMOS transistor 16 and into the base of transistor 20. This will render transistor 20 operative and enable a predetermined current to flow through transistor 20 thereby providing a source current at terminal 22 and, thus, pushing up the voltage level appearing at terminal 22 to a TTL logic high voltage level. Note, it is assumed that a load having a resistance is coupled to terminal 22. Further, since NMOS transistor 26 is rendered operative, NMOS transistor 26 will draw a predetermined current from the base of transistor 28 thereby rendering transistor 28 non-operative. In summary, when a CMOS logic high voltage level is applied to terminal 14, transistor 20 is rendered operative and provides a source current at terminal 22 thereby pushing up the voltage at terminal 22 to a TTL logic high voltage level.

On the other hand, when a CMOS logic low voltage level is applied to terminal 14, PMOS transistor 24 and NMOS transistor 18 are rendered operative, while NMOS transistor 26 and PMOS transistor 16 are rendered non-operative. Since NMOS transistor 18 is rendered operative, NMOS transistor 18 will draw a predetermined current from the base of transistor 20 thereby rendering transistor 20 non-operative. Further, since PMOS transistor 24 is rendered operative, current will flow from operating potential $V_{DD}$ through PMOS transistor 24 and into the base of transistor 28. This will render transistor 28 operative and enable transistor 28 to draw a sinking current from terminal 22 and, thus, pulling down the voltage level at terminal 22 to a TTL logic low voltage level. In summary, when a CMOS logic low voltage level is applied to terminal 14, transistor 28 is rendered operative and provides a sinking current at terminal 22 thereby pulling down the voltage at terminal 22 to a TTL logic low voltage level.

It is worth noting that PMOS transistor 24, when operative, functions similar to a resistor to provide a predetermined current into the base of transistor 28 thereby providing a DC drive current for transistor 28. Therefore, by varying the size of PMOS transistor 24, the ON resistance of PMOS transistor 24 can be varied thereby varying the current that is supplied to the base of transistor 28. In particular, as the size of PMOS transistor 24 is increased, the ON resistance of PMOS transistor 24 is decreased, and the current supplied to the base of transistor 28 increases which increases the DC drive of transistor 28. Therefore, it should be realized that PMOS transistor 24, when operative, controls the DC drive current at terminal 22.

Transient response control circuit 32 controls the edge speed (transient response) of a logic high to a logic low voltage level transition occurring at terminal 22. Initially, when the voltage level applied at terminal 14 transitions from a logic high voltage level to a logic low voltage level, the voltage level appearing at terminal 22 is still substantially equal to a logic high voltage level since it takes a finite time to pull down the voltage level at terminal 22 which can be due to parasitic capacitances, internal delays, etc. Further, the initial logic low voltage level at terminal 14 applies a logic low to the second input of NOR gate 36. Also, the substantially high logic voltage level occurring at terminal 22 is greater than reference voltage $V_{REF}$ and, thus, the output of comparator circuit 34 provides a logic low to the first input of NOR gate 36. Since both the first and the second inputs of NOR gate 36 are at a logic low, NOR gate 36 provides a logic high at its output and to the gate electrode of NMOS transistor 38. This will result in rendering NMOS transistor 38 operative which functions to increase the voltage at the base of transistor 28 thereby inducing additional current at the collector of transistor 28 and, thus, pulling down the voltage level at terminal 22 more rapidly. In a preferred embodiment, NMOS transistor 38 is substantially wider than PMOS transistor 24 and, thus, the additional current supplied at the collector of transistor 28 due to transient response control circuit 32 is substantially larger that the current provided thereto due to PMOS transistor 24. Thus, transient response control circuit 32 will provide a separate control for determining the edge rate of a logic high to a logic low transition occurring at terminal 22. For example, in the preferred embodiment, increasing the voltage at the base of transistor 28 during a logic high to logic low transition functions to speed up the edge rate (transient response) of a logic high level to logic low level transition, while maintaining the DC drive current during a logic low state substantially constant as determined by the size of PMOS transistor 24.

However, once the voltage level at terminal 22 falls below reference voltage $V_{REF}$, the output of comparator circuit 34 switches to a logic high thereby forcing the output of NOR gate 36 to a logic low. This will result in rendering NMOS transistor 38 non-operative. It should be understood that reference voltage $V_{REF}$ is a voltage that is between a TTL logic low voltage level and a TTL logic high voltage level. Further, it should be realized that transient response control circuit 32 is rendered operative only when the voltage level at input terminal 14 is indicative of a logic low voltage level and the voltage level appearing at terminal 22 is greater than reference voltage $V_{REF}$. Thus, transient response control circuit 32 increases the voltage at the base of transistor 28 thereby supplying a predetermined current at the collector of transistor 28 when a logic high to logic low voltage level transition is occurring at terminal 22. In other words, transient response control circuit 32 controls the edge speed of a logic high to logic low voltage level transition at terminal 22.

It is very important to note that only one implementation of transient response control circuit 32 is shown. However, transient response control circuit 32 can be any circuit that increases the voltage at the base of transistor 28 when the voltage levels sensed at terminals 14 and 22 are at predetermined levels. For example, comparator circuit 34 of transient response control circuit 32 can be substituted by a schmitt trigger which is responsive to the voltage level at terminal 22, or even an inverter circuit that switches in response to the voltage level at terminal 22.

Further, it is worth noting that transient response control circuit 32 is utilized for supplying additional current at the collector of transistor 28 when a logic high to logic low voltage level transition is occurring at terminal 22. However, it should be realized that a circuit similar to transient response control circuit 32 could also be utilized for supplying additional current at the emitter of transistor 20 when a logic low to logic high voltage level transition is occurring at terminal 22.

By now it should be apparent from the foregoing discussion that a novel circuit has been provided for an output driver circuit having independent DC drive and transient response controls.

I claim:

1. A circuit having an input signal applied at an input and an output signal provided at an output, comprising:

first means, having an input, for pushing current to the output of the circuit when said first means is operative;

second means, having an input, for pulling current from the output of the circuit when said second means is operative;

third means, responsive to the input signal and coupled to said inputs of said first and second means, for alternately rendering said first means and said second means operative, said third means controlling a DC drive of said second means; and fourth means for increasing the voltage at said input of said second means when the input and output signals are in predetermined logic states, said fourth means controlling the transient response of the output signal, said fourth means including:

(a) a comparator circuit having first and second inputs and an output, said first input being coupled to a terminal at which a reference voltage is applied, and said second input being coupled to the output of the circuit;

(b) a gate having first and second inputs and an output, said first input of said gate being coupled to said output of said comparator circuit, and said second input of said gate being coupled to the input of the circuit; and (c) a transistor having first, second and control electrodes, said first electrode being coupled to the output of the circuit, said second electrode being coupled to said input of said second means, and said control electrode being coupled to said input of said second means, and said control electrode being coupled to said output of said gate.

2. The circuit according to claim 1 wherein said third means includes:

a first transistor having first, second and control electrodes, said second electrode of said first transistor being coupled to a first supply voltage terminal, and said control electrode of said first transistor being coupled to the input of the circuit; and a second transistor having first, second and control electrodes, said first electrode of said second transistor being coupled to said first electrode of said first transistor, said second electrode of said second transistor being coupled to a second supply voltage terminal, and said control electrode of said second transistor being coupled to said control electrode of said first transistor;

an inverter having an input and an output, said input of said inverter being coupled to the input of the circuit;

a third transistor having first, second and control electrodes, said second electrode of said third transistor being coupled to said first supply voltage terminal, and said control electrode of said third transistor being coupled to said output of said inverter; and a fourth transistor having first, second and control electrodes, said first electrode of said fourth transistor being coupled to said first electrode of said third transistor, said second electrode of said fourth transistor being coupled to said second supply voltage terminal, and said control electrode of said fourth transistor being coupled to said output of said inverter.

3. The circuit according to claim 2 wherein said first means includes a transistor having a collector, a base and an emitter, said collector of said transistor of said first means being coupled to said first supply voltage terminal, said base of said transistor of said first means being coupled to said first electrodes of said third and fourth transistors of said third means, and said emitter of said transistor of said first means being coupled to the output of the circuit.

4. The circuit according to claim 3 wherein said second means includes a transistor having a collector, a base and an emitter, said collector of said transistor of said second means being coupled to the output of the circuit, said base being coupled to said first electrodes of said first and second transistors of said third means, and said emitter being coupled to said second supply voltage terminal.

5. The circuit according to claim 4 further including a clamp circuit coupled across said collector and said base of said transistor of said second means, said clamp circuit preventing said transistor of said second means from entering saturation.

6. A circuit having an input signal applied at an input and an output signal provided at an output, comprising:

first means, having an input, for pushing current to the output of the circuit when said first means is operative;

second means, having an input, for pulling current from the output of the circuit when said second means is operative;

third means, responsive to the input signal, for rendering said first means operative when the input signal is in a first logic state;

fourth means, responsive to the input signal, for rendering said second means operative when the input signal is in a second logic state, said fourth means controlling a DC drive of said second means; and fifth means, responsive to the input and output signals, for increasing the voltage at said input of said second means when the input and output signals are in predetermined logic states, said fifth means controlling the transient response of the output signal.

7. The circuit according to claim 6 wherein said fifth means includes:

a comparator circuit having first and second inputs and an output, said first input being coupled to a terminal at which a reference voltage is applied, and said second input being coupled to the output of the circuit;

a gate having first and second inputs and an output, said first input of said gate being coupled to said output of said comparator circuit, and said second input of said gate being coupled to the input of the circuit; and a transistor having first, second and control electrodes, said first electrode being coupled to the output of the circuit, said second electrode being coupled to said input of said second means, and said control electrode being coupled to said output of said gate.

8. The circuit according to claim 7 wherein said fourth means includes:

a first transistor having first, second and control electrodes, said second electrode of said first transistor being coupled to a first supply voltage terminal, and said control electrode of said first transistor being coupled to the input of the circuit; and a second transistor having first, second and control electrodes, said first electrode of said second transistor being coupled to said first electrode of said first transistor, said second electrode of said second transistor being coupled to a second supply voltage terminal, and said control electrode of said second transistor being coupled to said control electrode of said first transistor.

9. The circuit according to claim 8 wherein said third means includes:

an inverter having an input and an output, said input of said inverter being coupled to the input of the circuit;

a first transistor having first, second and control electrodes, said second electrode of said first transistor of said third means being coupled to said first supply voltage terminal, and said control electrode of said first transistor of said third means being coupled to said output of said inverter; and a second transistor having first, second and control electrodes, said first electrode of said second transistor of said third means being coupled to said first electrode of said first transistor of said third means, said second electrode of said second transistor of said third means being coupled to said second supply voltage terminal, and said control electrode of said second transistor of said third means being coupled to said output of said inverter.

10. The circuit according to claim 9 wherein said first means includes a transistor having a collector, a base and an emitter, said collector of said transistor of said first means being coupled to said first supply voltage terminal, said base of said transistor of said first means being coupled to said first electrodes of said first and second transistors of said third means, and said emitter of said transistor of said first means being coupled to the output of the circuit.

11. The circuit according to claim 10 wherein said second means includes a transistor having a collector, a base and an emitter, said collector of said transistor of said second means being coupled to the output of the circuit, said base of said transistor of said second means being coupled to said first electrodes of said first and second transistors of said fourth means, and said emitter of said transistor of said second means being coupled to said second supply voltage terminal.

12. The circuit according to claim 11 further including a clamp circuit coupled across said collector and said base of said transistor of said second means, said clamp circuit preventing said transistor of said second means from entering saturation.

13. An output driver circuit having a CMOS logic input signal applied at an input for providing a TTL logic output signal of output signal, comprising:
first means, having an input, for pushing current to the output of the circuit when said first means is operative;
second means, having an input; for pulling current from the output of the circuit when said second means is operative;
third means, responsive to the CMOS logic input signal, for rendering said first means operative when the CMOS logic input signal is in a first logic state;
fourth means, responsive to the CMOS logic input signal, for rendering said second means operative when the CMOS logic input signal is in a second logic state, said fourth means controlling a DC drive of said second means; and
fifth means, responsive to the CMOS logic input signal and the TTL logic output signal, for increasing the voltage at said input of said second means when the CMOS logic input signal and the TTL logic output signal are in predetermined logic states, said fifth means being active when the TTL logic output signal transitions from a logic high voltage level to a logic low voltage level such that said fifth means controls the transient response of the TTL logic output signal.

14. The circuit according to claim 13 wherein said fifth means includes:
a comparator circuit having first and second inputs and an output, said first input being coupled to a terminal at which a reference voltage is applied, and said second input being coupled to the output of the circuit;
a gate having first and second inputs and an output, said first input of said gate being coupled to said output of said comparator circuit, and said second input of said gate being coupled to the input of the circuit; and
a transistor having first, second and control electrodes, said first electrode being coupled to the output of the circuit, said second electrode being coupled to said input of said second means, and said control electrode being coupled to said output of said gate, said transistor of said fifth means supplies a predetermined current at said input of said second means when the TTL logic output signal is transistioning from a logic high voltage level to a logic low voltage level.

15. The circuit according to claim 14 wherein said fourth means includes:
a first transistor having first, second and control electrodes, said second electrode of said first transistor being coupled to a first supply voltage terminal, and said control electrode of said first transistor being coupled to the input of the circuit; and
a second transistor having first, second and control electrodes, said first electrode of said second transistor being coupled to said first electrode of said first transistor, said second electrode of said second transistor being coupled to a second supply voltage terminal, and said control electrode of said second transistor being coupled to said control electrode of said first transistor.

16. The circuit according to claim 15 wherein said third means includes:
an inverter having an input and an output, said input of said inverter being coupled to the input of the circuit;
a first transistor having first, second and control electrodes, said second electrode of said first transistor of said third means being coupled to said first supply voltage terminal, and said control electrode of said first transistor of said third means being coupled to said output of said inverter; and
a second transistor having first, second and control electrodes, said first electrode of said second transistor of said third means being coupled to said first electrode of said first transistor of said third means, said second electrode of said second transistor of said third means being coupled to said second supply voltage terminal, and said control electrode of said second transistor of said third means being coupled to said output of said inverter.

17. The circuit according to claim 16 wherein said first means includes a transistor having a collector, a base and an emitter, said collector of said transistor of said first means being coupled to said first supply voltage terminal, said base of said transistor of said first means being coupled to said first electrodes of said first and second transistors of said third means, and said emitter of said transistor of said first means being coupled to the output of the circuit.

18. The circuit according to claim 17 wherein said second means includes a transistor having a collector, a base and an emitter, said collector of said transistor of said second means being coupled to the output of the circuit, said base of said transistor of said second means being coupled to said first electrodes of said first and second transistors of said fourth means, and said emitter of said transistor of said second means being coupled to said second supply voltage terminal.

19. The circuit according to claim 18 further including a clamp circuit coupled across said collector and said base of said transistor of said second means, said clamp circuit preventing said transistor of said second means from entering saturation.

20. A method for providing an output driver circuit responsive to an input signal applied at an input for providing an output signal at an output and having independent DC drive and transient response controls, the method comprising the steps of:

supplying a first current at the output of the output driver circuit for pushing up the output signal to a logic high state when the input signal is in a first logic state;

supplying a second current at the output of the output driver circuit for pulling down the output signal to a logic low state when the input signal is in a second logic state, said second current providing a DC drive current;

sensing a voltage level of the output signal;

gating a voltage level of the input signal with said sensed voltage level of the output signal and providing a gate signal when the output signal is transitioning from a logic high voltage level to a logic low voltage level; and supplying an additional current at the output of the output driver circuit in response to said gate signal, said additional current controlling a transient response of the output signal.

* * * * *

UNITED STATES PATENT AND TRADEMARK OFFICE
CERTIFICATE OF CORRECTION

PATENT NO. : 5,038,058

DATED : August 6, 1991

INVENTOR(S) : Michael D. Wang

It is certified that error appears in the above-identified patent and that said Letters Patent is hereby corrected as shown below:

Column 5, lines 17, 18 and 19, claim 2, delete --input of said second means, and said control electrode being coupled to said--.

Column 7, line 37, claim 13, delete --of-- and insert therefor "at an".

Column 7, line 37, claim 13, delete the second occurrence of "signal".

Signed and Sealed this

Nineteenth Day of January, 1993

Attest:

DOUGLAS B. COMER

*Attesting Officer*    Acting Commissioner of Patents and Trademarks